(12) United States Patent
Ootagaki et al.

(10) Patent No.: US 9,694,371 B2
(45) Date of Patent: Jul. 4, 2017

(54) SUBSTRATE TREATMENT APPARATUS AND SUBSTRATE TREATMENT METHOD

(71) Applicant: SHIBAURA MECHATRONICS CORPORATION, Yokohama (JP)

(72) Inventors: Takashi Ootagaki, Yokohama (JP); Konosuke Hayashi, Yokohama (JP)

(73) Assignee: SHIBAURA MECHATRONICS CORPORATION, Yokohama-shi (JP)

(*) Notice: Subject to any disclaimer, the term of this patent is extended or adjusted under 35 U.S.C. 154(b) by 0 days.

(21) Appl. No.: 14/670,983

(22) Filed: Mar. 27, 2015

(65) Prior Publication Data
US 2015/0273491 A1 Oct. 1, 2015

(30) Foreign Application Priority Data

Mar. 31, 2014 (JP) ................. 2014-072791

(51) Int. Cl.

| | | |
|---|---|---|
| *B05C 5/02* | (2006.01) | |
| *B05B 1/26* | (2006.01) | |
| *B05B 3/10* | (2006.01) | |
| *H01L 21/67* | (2006.01) | |
| *B05B 3/04* | (2006.01) | |
| *B05C 13/02* | (2006.01) | |
| *B05B 13/02* | (2006.01) | |

(52) U.S. Cl.
CPC .......... *B05B 1/265* (2013.01); *B05B 3/0409* (2013.01); *B05B 3/0486* (2013.01); *B05B 3/1064* (2013.01); *B05B 13/0235* (2013.01); *B05C 13/02* (2013.01); *H01L 21/6715* (2013.01); *H01L 21/67051* (2013.01); *B05C 5/02* (2013.01)

(58) Field of Classification Search
CPC .......... B05C 13/02; B05C 5/02; Y10S 118/16
USPC ....................................... 427/240
See application file for complete search history.

(56) References Cited

U.S. PATENT DOCUMENTS

| | | | | |
|---|---|---|---|---|
| 5,896,877 A | * | 4/1999 | Pirker | ........... H01L 21/68735 134/153 |
| 7,531,039 B2 | * | 5/2009 | Sato | ........... B08B 17/00 118/326 |
| 2003/0164406 A1 | * | 9/2003 | Ballu | ........... B05B 5/0407 239/224 |

FOREIGN PATENT DOCUMENTS

| | | | |
|---|---|---|---|
| JP | 200345840 | * | 2/2003 |
| JP | 2005052828 | * | 3/2005 |
| JP | 2005-217138 | | 8/2005 |

* cited by examiner

*Primary Examiner* — Laura Edwards
(74) *Attorney, Agent, or Firm* — Oblon, McClelland, Maier & Neustadt, L.L.P.

(57) ABSTRACT

A substrate treatment apparatus according to the embodiment includes: a nozzle which ejects a treatment liquid onto a treatment target surface of a substrate; a trajectory deflector including a trajectory deflecting surface, which is an annular inclined surface that deflects a traveling direction of the treatment liquid ejected from the nozzle and makes the treatment liquid incident on the treatment target surface, the trajectory deflecting surface having an inclination angle varying in a direction of annular extension of the trajectory deflecting surface; and a position changer which moves an incident position of the treatment liquid on the trajectory deflecting surface in the direction of annular extension of the trajectory deflecting surface.

9 Claims, 7 Drawing Sheets

SUBSTRATE TREATMENT APPARATUS AND SUBSTRATE TREATMENT METHOD

CROSS-REFERENCE TO THE RELATED APPLICATION

This application is based on and claims the benefit of priority from Japanese Patent Application No. 2014-72791, filed on Mar. 31, 2014; the entire contents of which are incorporated herein by reference.

FIELD

Embodiments described herein relate generally to a substrate treatment apparatus and a substrate treatment method.

BACKGROUND

A substrate treatment apparatus is an apparatus used in manufacturing processes of semiconductor devices, liquid crystal display panels, and the like, and configured to perform a treatment on a surface of a substrate such as a wafer and a liquid crystal substrate by supplying a treatment liquid (such as a resist stripping liquid and a cleaning liquid) to the surface of the substrate. As one of such substrate treatment apparatuses, there has been developed an apparatus configured to perform spin-processing by supplying a treatment liquid to approximately the center of a top surface of a substrate from a nozzle while horizontally rotating the substrate, and thereby spreading the treatment liquid over the surface of the substrate by centrifugal force. Moreover, there has also been developed an apparatus configured to jet a treatment liquid to a bottom surface of a rotating substrate in addition to its top surface from the nozzle, and thereby to perform a treatment on the two surfaces of the substrate.

When the substrate is increased in size, coverage of the treatment liquid over the substrate is reduced. In this case, however, a simple increase in amount of the treatment liquid leads to an increase in manufacturing cost. On the other hand, in order to improve the coverage of the treatment liquid over the substrate, the nozzle may be moved along the bottom surface of the substrate. In this case, however, the apparatus needs to be provided with a movement mechanism for the nozzle, which results in complication of the apparatus and accordingly an increase in equipment cost. Furthermore, if the movement mechanism moves the nozzle during the treatment, generation of dust or the like may occur and thereby lead to reduction in yield. From the viewpoints mentioned above, there is a demand for a technique that improves coverage of a treatment liquid over a substrate while suppressing an increase in manufacturing cost or equipment cost as well as reduction in yield.

DETAILED DESCRIPTION

According to one embodiment, a substrate treatment apparatus includes: a nozzle configured to eject a treatment liquid onto a treatment target surface of a substrate; a trajectory deflector including a trajectory deflecting surface being an annular inclined surface designed to deflect a traveling direction of the treatment liquid ejected from the nozzle and to make the treatment liquid incident on the treatment target surface, the trajectory deflecting surface having an inclination angle varying in a direction of annular extension of the trajectory deflecting surface; and a position changer configured to move an incident position of the treatment liquid on the trajectory deflecting surface in the direction of annular extension of the trajectory deflecting surface.

According to another embodiment, a substrate treatment method includes the steps of: ejecting a treatment liquid from a nozzle onto a treatment target surface of a substrate; deflecting a traveling direction of the treatment liquid ejected from the nozzle with a trajectory deflecting surface and making the treatment liquid incident on the treatment target surface, the trajectory deflecting surface being an annular inclined surface of a trajectory deflector and having an inclination angle varying in a direction of annular extension of the trajectory deflecting surface; and moving an incident position of the treatment liquid on the trajectory deflecting surface in the direction of annular extension of the trajectory deflecting surface.

Various Embodiments will be described hereinafter with reference to the accompanying drawings.

(First Embodiment)

A first embodiment will be described with reference to FIG. 1 to FIG. 6.

Figure 1:
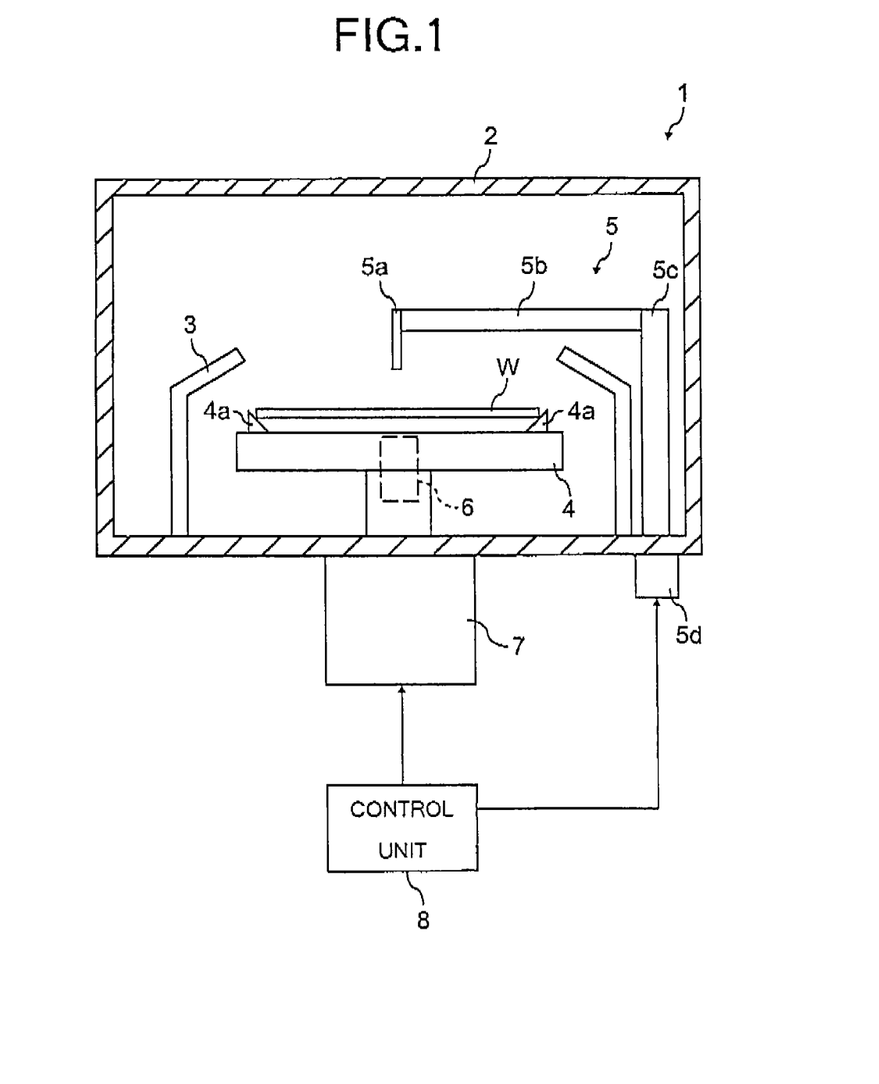
FIG. 1 is a diagram showing a schematic configuration of a substrate treatment apparatus according to a first embodiment.

As shown in FIG. 1, a substrate treatment apparatus 1 according to the first embodiment includes: a treatment box 2 serving as a treatment chamber; a cup 3 provided inside the treatment box 2; a table 4 horizontally supporting a substrate W inside the cup 3; a first treatment liquid supply unit 5 which supplies a treatment liquid to a top surface (a first treatment target surface) of the substrate W on the table 4; a second treatment liquid supply unit 6 which supplies the treatment liquid to a bottom surface (a second treatment target surface) of the substrate W on the table 4; a rotation mechanism 7 which rotates the table 4 and the like in a horizontal plane; and a control unit 8 which controls the above-mentioned constituents.

The cup 3 is formed into a cylindrical shape and is designed to surround the table 4 and to house the table 4 inside. An upper part of a peripheral wall of the cup 3 is inclined radially inward, and is opened so as to expose the substrate W on the table 4. The cup 3 receives a treatment liquid running off or splattering from the rotating substrate W. Here, a drain pipe (not shown) to drain the received treatment liquid is connected to a bottom part of the cup 3.

The table 4 is located near the center of the inside of the cup 3, and is made rotatable in the horizontal plane. The table 4 includes multiple supporting members 4a such as pins, and functions as a supporting unit by way of the supporting members 4a, which is configured to detachably support the substrate W such as a wafer and a liquid crystal substrate.

The first treatment liquid supply unit 5 includes: a nozzle 5a which ejects the treatment liquid onto the top surface of the substrate W on the table 4; an arm 5b which supports the nozzle 5a; a pillar 5c which swings the arm 5b while supporting one end portion thereof in such a way as to be turnable in a horizontal plane; and a motor 5d serving as a drive source for the swing.

The nozzle 5a is provided at a tip end of the arm 5b and is connected to a liquid reservoir, a pump, an electromagnetic valve, and the like through piping (which are not shown). The pump and the electromagnetic valve are electrically connected to the control unit 8 and their drive is controlled by the control unit 8. The arm 5b is turned around the pillar 5c and along the top surface of the substrate W on the table 4. Accordingly, the nozzle 5a supported by the arm 5b also moves along the top surface of the substrate W. The motor 5d is electrically connected to the control unit 8 and its drive is controlled by the control unit 8.

For example, the nozzle 5a moves together with the swing of the arm 5b, and travels to a liquid supply position (a treatment position) opposed to approximately the center of the top surface of the substrate W on the table 4, and to a stand-by position retreating from the liquid supply position so as to enable loading and unloading of the substrate W onto and away from the table 4.

Figure 2:
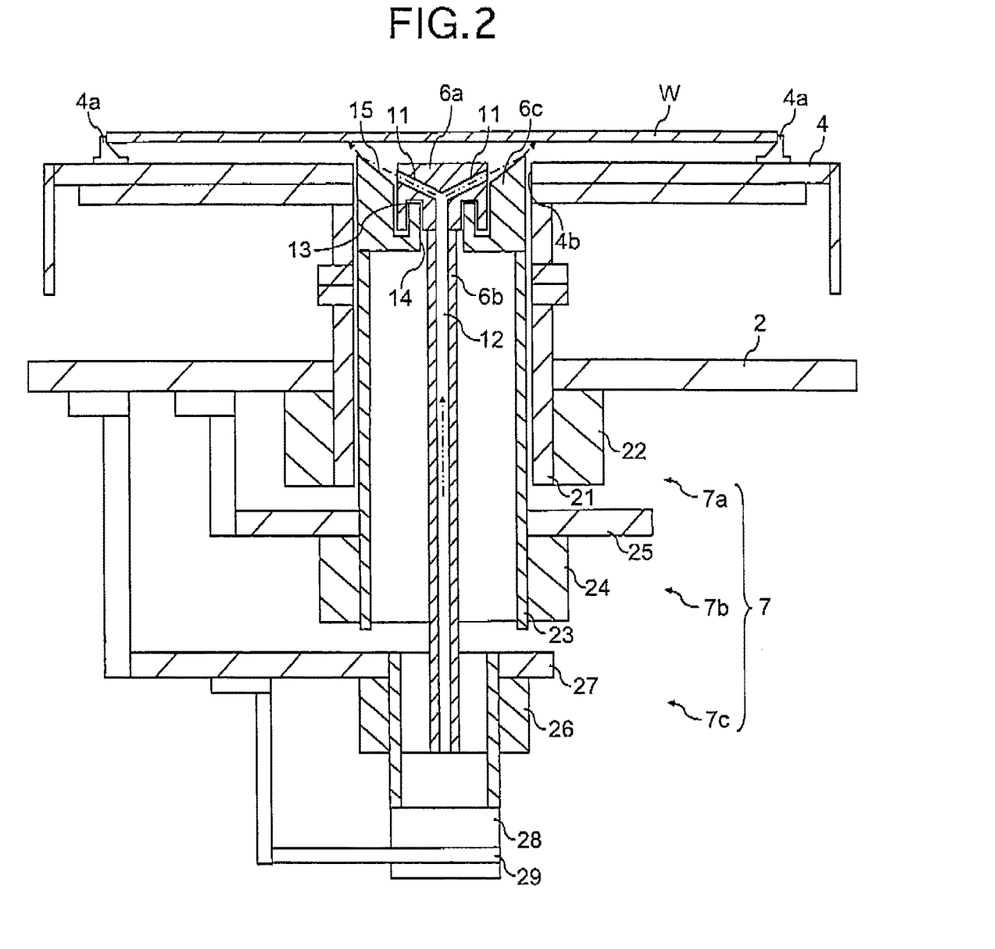
FIG. 2 is a cross-sectional view showing a schematic configuration of part (a rotation mechanism and a second treatment liquid supply unit) of the substrate treatment apparatus according to the first embodiment.

As shown in FIG. 2, the second treatment liquid supply unit 6 includes: a nozzle block 6a which ejects the treatment liquid toward the bottom surface of the substrate W on the table 4; a nozzle pipe 6b which supplies the treatment liquid to the nozzle block 6a; and a trajectory deflector 6c which deflects a traveling direction of the treatment liquid (an ejected liquid) ejected from the nozzle block 6a toward the bottom surface of the substrate W.

The nozzle block 6a includes multiple nozzle flow passages, i.e., multiple nozzles 11 which respectively eject the treatment liquid. The nozzle block 6a is provided inside an opening 4b located at approximately the center of the table 4 so that the nozzle block 6a can supply the treatment liquid from the nozzles 11 to the bottom surface of the substrate W on the table 4.

The nozzle pipe 6b includes a liquid supply passage 12 joined to the nozzles 11 of the nozzle block 6a and designed to supply the treatment liquid thereto. The liquid supply passage 12 is connected to a liquid reservoir, a pump, an electromagnetic valve, and the like through piping (which are not shown). The pump and the electromagnetic valve are electrically connected to the control unit 8 and their drive is controlled by the control unit 8.

The trajectory deflector 6c includes: a housing unit 13 which rotatably houses the nozzle block 6a; a through-hole 14 where the nozzle pipe 6b passes through; and an inclined surface (a trajectory deflecting surface) 15 which deflects the traveling direction of the treatment liquid ejected from each nozzle 11. The inclined surface 15 is formed on an upper surface of the trajectory deflector 6c into an annular shape that extends in a rotational direction of the substrate W, and is inclined in such a way as to gradually rise from the inside to the outside of the substrate W. Moreover, the inclined surface 15 is either a continuous surface with an inclination angle gradually and continuously increased along the rotational direction of the substrate W, or a non-smooth (stepped) surface with an inclination angle changing stepwise along the rotational direction of the substrate W (to be described later in detail). The inclined surface 15 deflects the treatment liquid ejected from each nozzle 11 in accordance with the inclination angle, and makes the treatment liquid incident on the bottom surface of the substrate W on the table 4. In other words, when the treatment liquid ejected from each nozzle 11 hits (collides with) the inclined surface 15, its traveling direction is changed in accordance with the inclination angle of the inclined surface 15, and the treatment liquid is made incident on the bottom surface of the substrate W.

The rotation mechanism 7 includes: a table rotation mechanism 7a which rotates the table 4 about the center of the table 4 as its rotational axis; a deflector rotation mechanism 7b which rotates the trajectory deflector 6c about the rotational axis of the table 4 as its rotational center; and a nozzle rotation mechanism 7c which rotates the nozzle block 6a and the nozzle pipe 6b about the rotational axis of the table 4 as its rotational center. Here, the deflector rotation mechanism 7b or the nozzle rotation mechanism 7c functions as a position changer which moves an incident position on the inclined surface 15, on which the treatment liquid is made incident, in the direction of annular extension of the inclined surface 15.

The table rotation mechanism 7a includes a hollow rotating shaft 21 connected to the table 4, and a motor 22 serving as a drive source to rotate the rotating shaft 21. The rotating shaft 21 is a shaft which intersects perpendicularly to the table 4, for example. The motor 22 is a hollow motor, for example, and the rotating shaft 21 is inserted into the motor 22. The motor 22 is provided on an outer surface of the treatment box 2. The motor 22 is electrically connected to the control unit 8, and the drive thereof is controlled by the control unit 8. The table rotation mechanism 7a rotates the table 4 through the rotating shaft 21 by using the motor 22.

The deflector rotation mechanism 7b includes a hollow rotating shaft 23 connected to the trajectory deflector 6c, a motor 24 serving as a drive source to rotate the rotating shaft 23, and a holding member 25 which holds the motor 24. The rotating shaft 23 is a shaft which intersects perpendicularly to the table 4, for example. The motor 24 is a hollow motor, for example, and the rotating shaft 23 is inserted into the motor 24. The motor 24 is electrically connected to the control unit 8, and the drive thereof is controlled by the control unit 8. The holding member 25 is formed to hold the motor 24, and is fixed to a lower surface of the treatment box 2. The deflector rotation mechanism 7b rotates the trajectory deflector 6c through the rotating shaft 23 by using the motor 24.

The nozzle rotation mechanism 7c includes a motor 26 serving as a drive source to rotate the nozzle pipe 6b connected to the nozzle block 6a, a holding member 27 which holds the motor 26, a rotary joint 28 which functions as a connector for the nozzle pipe 6b, and a holding member 29 which holds the rotary joint 28. The motor 26 is a hollow motor, for example, and the nozzle pipe 6b is inserted into the motor 26. The motor 26 is electrically connected to the control unit 8, and the drive thereof is controlled by the control unit 8. The holding member 27 is formed to hold the motor 26, and is fixed to the lower surface of the treatment box 2. Likewise, the holding member 29 is formed to hold the rotary joint 28, and is fixed to the lower surface of the holding member 27. The nozzle rotation mechanism 7c rotates the nozzle block 6a through the nozzle pipe 6b by using the motor 26.

Back to FIG. 1, the control unit 8 includes a microcomputer (not shown) which intensively controls the aforementioned constituents, and a storage unit (not shown) which stores substrate treatment information concerning a substrate treatment, various programs, and the like. The control unit 8 controls the units including the first treatment liquid supply unit 5, the second treatment liquid supply unit 6, the rotation mechanism 7, and the like based on the substrate treatment information and the various programs, thereby performing the processing to supply the treatment liquid to the top surface of the substrate W on the rotating table 4 by using the first treatment liquid supply unit 5 and to supply the treatment liquid to the bottom surface of the substrate W on the rotating table 4 by using the second treatment liquid supply unit 6.

Here, if the top surface and the bottom surface of the substrate W are subjected to the treatment at the same time, then the substrate W has to be rotated in order to perform the treatment on the top surface of the substrate W. In this case, it is possible to rotate the trajectory deflector 6c while not rotating the nozzle block 6a (while fixing the nozzle block 6a). At this time, the rotational directions of the substrate W and the trajectory deflector 6c may be set reverse to each other. Alternatively, the rotational directions may be set in the same direction. However, if the rotational directions of the substrate W and the trajectory deflector 6c are set in the same direction, then it is preferable to set rotating speeds thereof different from each other. In the meantime, it is also possible to rotate the nozzle block 6a while not rotating the trajectory deflector 6c (while fixing the trajectory deflector 6c). In this case as well, the rotational directions of the substrate W and the nozzle block 6a may be set reverse to each other. Alternatively, the rotational directions may be set in the same direction. However, if the rotational directions of the substrate W and the nozzle block 6a are set in the same direction, then it is preferable to set rotating speeds thereof different from each other. Here, each of the rotating speeds does not have to be a constant speed, and each rotating speed may be changed as appropriate.

On the other hand, if the top surface and the bottom surface of the substrate W are not subjected to the treatment at the same time, then one or both of the nozzle block 6a and the trajectory deflector 6c may be rotated at the time of performing the treatment on the bottom surface of the substrate W while not rotating the substrate W (while fixing the substrate W). Here, the substrate W may of course be rotated instead. In this case, it is preferable to set the rotational directions of the nozzle block 6a and the trajectory deflector 6c reverse to each other. Nonetheless, the rotational directions may be set in the same direction. However, if the rotational directions of the nozzle block 6a and the trajectory deflector 6c are set in the same direction, then it is necessary to set rotating speeds thereof different from each other. Here, each of the rotating speeds does not have to be a constant speed, and each rotating speed may be changed as appropriate. Moreover, the rotation may be performed either continuously or intermittently.

Next, the inclined surface (the trajectory deflecting surface) 15 of the trajectory deflector 6c will be described with reference to FIG. 3 to FIG. 6. Note that in FIG. 3 and FIG. 6, a variation in the inclination angle of the inclined surface 15 is illustrated in gray scale. Here, a darker portion has a larger inclination angle. It is to be also noted that a moving direction of the incident position (an incident point) of the treatment liquid on the inclined surface 15 is a direction reverse to a rotational direction B1 of the substrate W.

Figure 3:
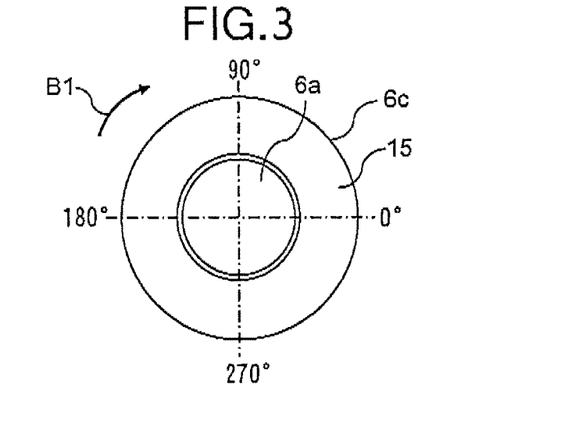
FIG. 3 is a plan view showing an inclined surface (a first example) of a trajectory deflector according to the first embodiment.
Figure 4:
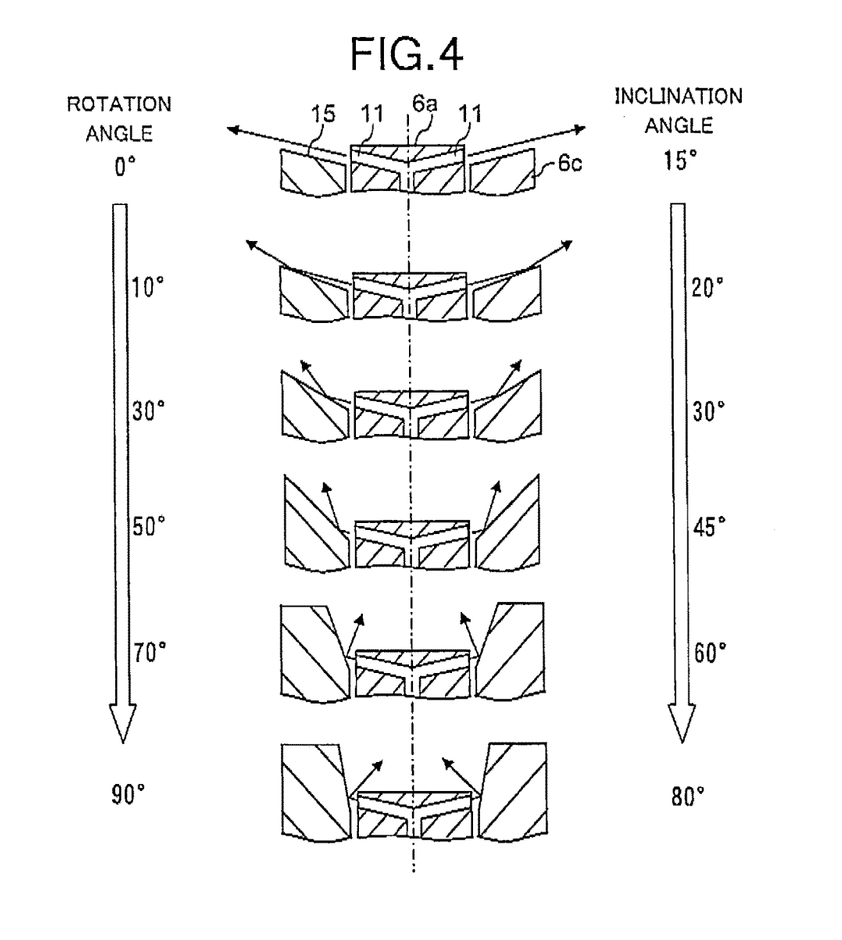
FIG. 4 is an explanatory diagram for explaining a variation in trajectory of a treatment liquid caused by the inclined surface of the trajectory deflector according to the first embodiment.

First, a description will be given of a case where the inclined surface 15 of the trajectory deflector 6c is a continuous surface as shown in FIG. 3 and FIG. 4. For example, the inclination angle of the inclined surface 15 is equal to 15 degrees when a rotation angle of the trajectory deflector 6c is equal to 0 degrees, 20 degrees when the rotation angle of the trajectory deflector 6c is equal to 10 degrees, 30 degrees when the rotation angle of the trajectory deflector 6c is equal to 30 degrees, 45 degrees when the rotation angle of the trajectory deflector 6c is equal to 50 degrees, 60 degrees when the rotation angle of the trajectory deflector 6c is equal to 70 degrees, and 80 degrees when the rotation angle of the trajectory deflector 6c is equal to 90 degrees.

Here, the variation in the inclination angle relative to the rotation angle of the trajectory deflector 6c in a range from 90 degrees to 180 degrees becomes reverse to the variation in the inclination angle relative to the rotation angle of the trajectory deflector 6c in the range from 0 degrees to 90 degrees. Meanwhile, the variation in the inclination angle relative to the rotation angle of the trajectory deflector 6c in a range from 180 degrees to 270 degrees is the same as the variation in the inclination angle relative to the rotation angle of the trajectory deflector 6c in the range from 0 degrees to 90 degrees. The variation in the inclination angle relative to the rotation angle of the trajectory deflector 6c in a range from 270 degrees to 360 degrees becomes reverse to the variation in the inclination angle relative to the rotation angle of the trajectory deflector 6c in the range from 0 degrees to 90 degrees.

When the incident position (a collision position) of the treatment liquid on the inclined surface 15 having the above-described variation in the inclination angle moves in the direction of annular extension of the inclined surface 15 (the direction reverse to the rotational direction B1 of the substrate W), the traveling direction of the treatment liquid is gradually changed in accordance with the inclination angle of the inclined surface 15 (see FIG. 4). When the rotation angle of the trajectory deflector 6c is equal to 0 degrees, the treatment liquid travels directly without being deflected. Thereafter, the inclination angle of the inclined surface 15 becomes larger along with the increase in the rotation angle of the trajectory deflector 6c, and the treatment liquid is gradually deflected larger along with the increase in the rotation angle.

Here, FIG. 4 shows an example in which the incident angle and a reflection angle of the treatment liquid with respect to the inclined surface 15 are assumed to be equal to each other, and changes in the traveling direction of the treatment liquid are schematically illustrated with arrows. However, the traveling direction of the treatment liquid is not always changed as illustrated therein. For instance, the traveling direction of the treatment liquid may be changed in a direction along the inclined surface 15 depending on a relative movement speed or a clearance between inclined surface 15 and an ejection port of the nozzle 11 that travel relative to each other along with the rotation, occurrence of an air low (strength of the air flow) attributed to the relative movement, and the like. In this case, it is still possible to control the traveling direction by means of the inclination angle of the inclined surface 15.

Here, the variation in the traveling direction (a trajectory variation) of the treatment liquid relative to the rotation angle of the trajectory deflector 6c in the range from 90 degrees to 180 degrees becomes reverse to the variation in the traveling direction of the treatment liquid relative to the rotation angle of the trajectory deflector 6c in the range from 0 degrees to 90 degrees. Meanwhile, the variation in the traveling direction of the treatment liquid relative to the rotation angle of the trajectory deflector 6c in the range from 180 degrees to 270 degrees is the same as the variation in the traveling direction of the treatment liquid relative to the rotation angle of the trajectory deflector 6c in the range from 0 degrees to 90 degrees. The variation in the traveling direction of the treatment liquid relative to the rotation angle of the trajectory deflector 6c in the range from 270 degrees to 360 degrees becomes reverse to the variation in the traveling direction of the treatment liquid relative to the rotation angle of the trajectory deflector 6c in the range from 0 degrees to 90 degrees.

Figure 5:
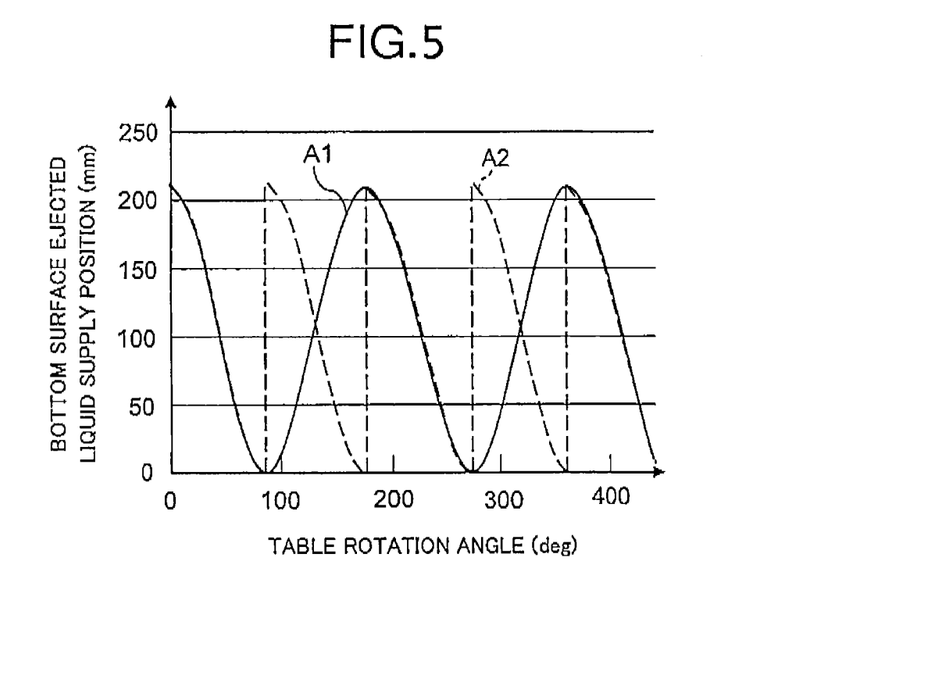
FIG. 5 is a graph showing a relation between a table rotation angle and a bottom surface ejected liquid supply position according to the first embodiment.

Here, as indicated with a graph A1 (a solid line) in FIG. 5, when the rotation angle of the trajectory deflector 6c transitions from 0 degrees to 90 degrees, the inclination angle of the inclined surface 15 is gradually increased (see FIG. 3 and FIG. 4), whereby an ejected liquid supply position (a bottom surface ejected liquid supply position) on the bottom surface of the substrate W gradually moves from 210 mm closer to 0 mm (the center of the substrate W). Furthermore, when the rotation angle of the trajectory deflector 6c transitions from 90 degrees to 180 degrees, the inclination angle of the trajectory deflector 6c is gradually decreased, whereby the bottom surface ejected liquid supply position gradually moves away from 0 mm to 210 mm. Thereafter, when the rotation angle of the trajectory deflector 6c transitions from 180 degrees to 270 degrees, the inclination angle of the inclined surface 15 is gradually increased again, whereby the bottom surface ejected liquid supply position gradually moves from 210 mm closer to 0 mm. Furthermore, when the rotation angle of the trajectory deflector 6c transitions from 270 degrees to 360 degrees, the inclination angle of the trajectory deflector 6c is gradually decreased, whereby the bottom surface ejected liquid supply position gradually moves away from 0 mm to 210 mm. Thus, the bottom surface ejected liquid supply position is changed depending on the inclination angle of the inclined surface 15 of the trajectory deflector 6c.

Here, the bottom surface ejected liquid supply position (the collision position of the ejected liquid on the bottom surface of the substrate W) is set in the range from 0 mm to 210 mm. However, the setting is not limited to the foregoing. The bottom surface ejected liquid supply position can be adjusted by changing the inclination angle of the inclined surface 15 of the trajectory deflector 6c, an ejection angle of each nozzle 11, the clearance between the inclined surface 15 and the nozzle 11, and the like. Accordingly, the position of the ejected liquid to be supplied to a position near the center of the bottom surface of the substrate W does not always have to be set to 0 mm being the center of the substrate W. For example, the position of the ejected liquid may be set to a position at about 10 mm away from the center of the substrate W. Meanwhile, the position of the ejected liquid supplied to an outer peripheral side on the bottom surface of the substrate W is not limited and may be set to a position farther than 210 mm.

Figure 6:
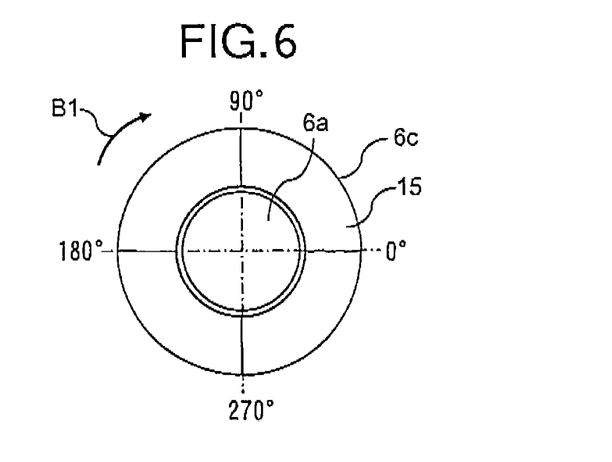
FIG. 6 is a plan view showing an inclined surface (a second example) of the trajectory deflector according to the first embodiment.

Next, a description will be given of a case where the inclined surface 15 of the trajectory deflector 6c is a non-smooth surface as shown in FIG. 6. For example, the inclination angle of the inclined surface 15 is gradually increased from 15 degrees to the 80 degrees when the rotation angle of the trajectory deflector 6c transitions from 0 degrees to 90 degrees, and is gradually increased from 15 degrees to the 80 degrees when the rotation angle of the trajectory deflector 6c transitions from 90 degrees to 180 degrees. Likewise, the inclination angle of the inclined surface 15 is gradually increased from 15 degrees to the 80 degrees when the rotation angle of the trajectory deflector 6c transitions from 180 degrees to 270 degrees, and is gradually increased from 15 degrees to the 80 degrees when the rotation angle of the trajectory deflector 6c transitions from 270 degrees to 360 degrees. When the incident position of the treatment liquid on the inclined surface 15 having the above-described variation in the inclination angle moves in the direction of annular extension of the inclined surface 15 (the direction reverse to the rotational direction B1 of the substrate W), the traveling direction of the treatment liquid is gradually changed in accordance with the inclination angle of the inclined surface 15.

Here, as indicated with a graph A2 (a dashed line) in FIG. 5, when the rotation angle of the trajectory deflector 6c transitions from 0 degrees to 90 degrees, the inclination angle of the inclined surface 15 is gradually increased (see FIG. 6), whereby the ejected liquid supply position (the bottom surface ejected liquid supply position) on the bottom surface of the substrate W gradually moves from 210 mm closer to 0 mm. Furthermore, when the rotation angle of the trajectory deflector 6c transitions from 90 degrees to 180 degrees, the inclination angle of the inclined surface 15 is gradually increased, whereby the bottom surface ejected liquid supply position gradually moves from 210 mm closer to 0 mm. Likewise, when the rotation angle of the trajectory deflector 6c transitions from 180 degrees to 270 degrees, the inclination angle of the inclined surface 15 is gradually increased, whereby the bottom surface ejected liquid supply position gradually moves from 210 mm closer to 0 mm. Furthermore, when the rotation angle of the trajectory deflector 6c transitions from 270 degrees to 360 degrees, the inclination angle of the inclined surface 15 is gradually increased, whereby the bottom surface ejected liquid supply position gradually moves from 210 mm closer to 0 mm. Thus, the bottom surface ejected liquid supply position is changed depending on the inclination angle of the inclined surface 15 of the trajectory deflector 6c.

As described above, the traveling direction of the ejected liquid (the treatment liquid) ejected from each of the nozzles 11 is deflected toward the bottom surface of the substrate W by the inclined surface 15 of the trajectory deflector 6c, or in other words, a traveling angle of the treatment liquid is changed. Thus, a supply position (a landing position) of the ejected liquid on the bottom surface of the substrate W is changed in a radial direction of the substrate W. Accordingly, as compared to a case where the treatment liquid is supplied to one position on the bottom surface of the substrate W, for example, the treatment liquid can easily reach the outer peripheral portion on the bottom surface of the substrate W, whereby the bottom surface of the substrate W is more reliably covered with the treatment liquid. In this way, even when the substrate W is increased in size, it is possible to improve coverage of the treatment liquid over the substrate W without increasing the amount of the treatment liquid, and thereby to suppress an increase in manufacturing cost. Moreover, it is not necessary to provide a movement mechanism for moving the nozzles 11 along the bottom surface of the substrate W in order to improve the coverage of the treatment liquid over the substrate W. Accordingly, it is possible to suppress an increase in equipment cost attributed to complication of the apparatus, and to suppress reduction in yield due to dust and grit caused by the movement of the nozzles by the movement mechanism during the treatment.

Note that the supply position (the landing position) of the ejected liquid on the bottom surface of the substrate W does not always have to be changed in the radial direction at a constant speed by the deflection of the trajectory of the ejected liquid by using the inclined surface 15 of the trajectory deflector 6c. Instead, the movement speed of the supply position in the radial direction of the substrate W may be changed during the treatment. In this case, it is possible to change the movement speed of the supply position in the radial direction of the substrate W by adjusting a rotating speed of the trajectory deflector 6c, the length in the annular direction of the inclined surface 15, the rotating speed of the nozzle block 6a, and the like. When the bottom surface of the substrate W is constantly subjected to the treatment, for example, the degree of progress of the treatment may be slowed down on the outer peripheral side of the substrate W. Accordingly, the treatment liquid needs to be intensively supplied to the outer peripheral portion of the substrate W. For this reason, the movement speed of the supply position in the radial direction of the substrate W may be set slower on the outer peripheral side of the substrate W than the movement speed applied to the center of the bottom surface of the substrate W. Furthermore, when the degree of progress of the treatment is changed depending on the location on the bottom surface of the substrate W, the movement speed of the supply position in the radiation direction of the substrate W may be adjusted in accordance with a difference in the degree of progress at each position.

As described above, according to the first embodiment, the supply position of the treatment liquid on the bottom surface of the substrate W can be changed by causing the incident position of the treatment liquid on the annular inclined surface (the trajectory deflecting surface) 15, whose inclination angle varies in the direction of annular extension of the inclined surface 15, to move in the direction of annular extension. Thus, the treatment liquid easily reaches the outer peripheral portion on the bottom surface of the substrate W without requiring an increase in amount of the treatment liquid or provision of a complicated mechanism. Accordingly, the bottom surface of the substrate W is surely covered by the treatment liquid. As a consequence, since the increase in amount of the treatment liquid or the provision of the complicated mechanism is not required, it is possible to improve the coverage of the treatment liquid over the substrate W while suppressing the increase in manufacturing cost or equipment cost as well as reduction in yield.

(Second Embodiment)

A second embodiment will be described with reference to FIG. 7 to FIG. 11. Note that different features (such as the trajectory deflector 6c and the nozzle 11) from those in the first embodiment will be described in the second embodiment, and other descriptions will be omitted therein.

Figure 7:
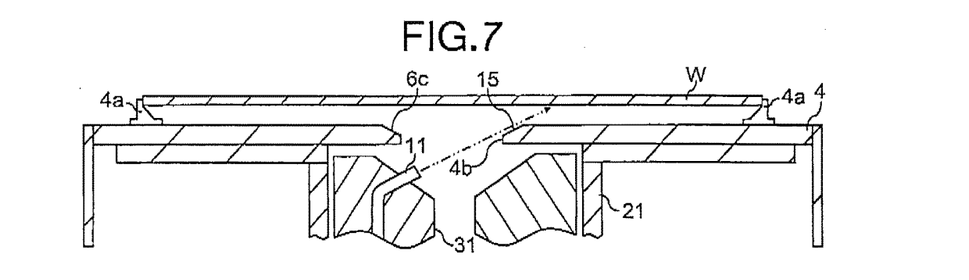
FIG. 7 is a cross-sectional view showing a schematic configuration of a trajectory deflector according to a second embodiment.

As shown in FIG. 7, a single nozzle 11, a liquid drain pipe 31, and the like are provided in the second embodiment. Unlike the first embodiment, the single nozzle 11 is fixed without changing its position by rotation and the like. Here, the nozzle 11 is formed to be capable of ejecting the treatment liquid onto the bottom surface of the substrate W on the table 4. Meanwhile, the trajectory deflector 6c is formed at the opening 4b of the table 4. In other words, the inclined surface 15 of the trajectory deflector 6c is formed on an upper end of the opening 4b in such a way as to deflect the treatment liquid ejected from the nozzle 11 toward the bottom surface of the substrate W on the table 4. Note that the nozzle block 6a, the deflector rotation mechanism 7b, the nozzle rotation mechanism 7c, and the like according to the first embodiment are not provided in the second embodiment.

The inclined surface (the trajectory deflecting surface) 15 of the trajectory deflector 6c will be described with reference to FIG. 8 to FIG. 11. Note that in FIG. 8 and FIG. 11, the variation in the inclination angle of the inclined surface 15 is illustrated in gray scale. Here, a darker portion has a larger inclination angle. It is to be also noted that the moving direction of the incident position (the incident point) of the treatment liquid on the inclined surface 15 is the direction reverse to the rotational direction B1 of the substrate W.

Figure 8:
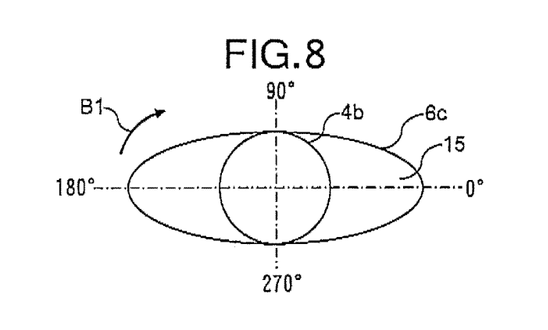
FIG. 8 is a plan view showing an inclined surface (a third example) of the trajectory deflector according to the second embodiment.
Figure 9:
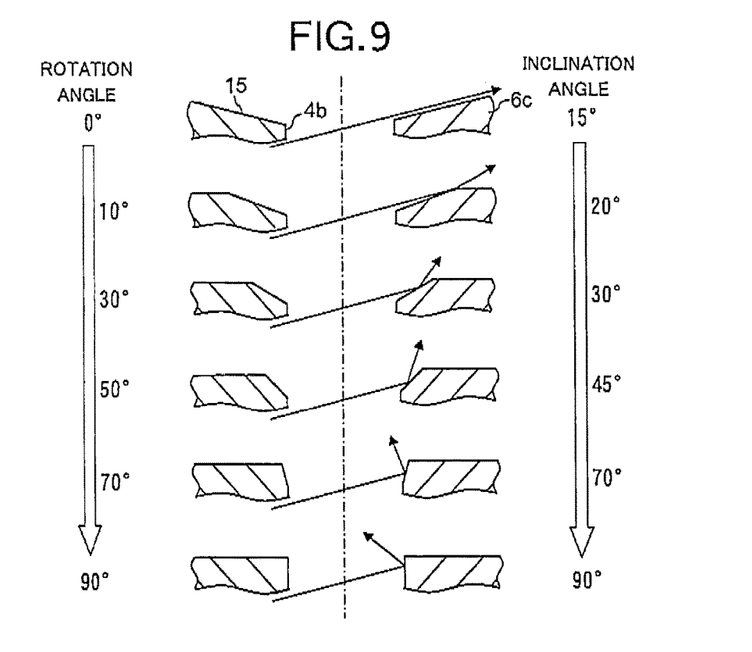
FIG. 9 is an explanatory diagram for explaining a variation in trajectory of a treatment liquid caused by the inclined surface of the trajectory deflector according to the second embodiment.

First, a description will be given of a case where the inclined surface 15 of the trajectory deflector 6c is a continuous surface as shown in FIG. 8 and FIG. 9. For example, the inclination angle of the inclined surface 15 is equal to 15 degrees when the rotation angle of the trajectory deflector 6c is equal to 0 degrees, 20 degrees when the rotation angle of the trajectory deflector 6c is equal to 10 degrees, 30 degrees when the rotation angle of the trajectory deflector 6c is equal to 30 degrees, 45 degrees when the rotation angle of the trajectory deflector 6c is equal to 50 degrees, 70 degrees when the rotation angle of the trajectory deflector 6c is equal to 70 degrees, and 90 degrees when the rotation angle of the trajectory deflector 6c is equal to 90 degrees.

Here, the variation in the inclination angle relative to the rotation angle of the trajectory deflector 6c in the range from 90 degrees to 180 degrees becomes reverse to the variation in the inclination angle relative to the rotation angle of the trajectory deflector 6c in the range from 0 degrees to 90 degrees. Meanwhile, the variation in the inclination angle relative to the rotation angle of the trajectory deflector 6c in the range from 180 degrees to 270 degrees is the same as the variation in the inclination angle relative to the rotation angle of the trajectory deflector Sc in the range from 0 degrees to 90 degrees. The variation in the inclination angle relative to the rotation angle of the trajectory deflector 6c in the range from 270 degrees to 360 degrees becomes reverse to the variation in the inclination angle relative to the rotation angle of the trajectory deflector 6c in the range from 0 degrees to 90 degrees.

When the incident position of the treatment liquid on the inclined surface 15 having the above-described variation in the inclination angle moves in the direction of annular extension of the inclined surface 15 (the direction reverse to the rotational direction B1 of the substrate W), the traveling direction of the treatment liquid is gradually changed in accordance with the inclination angle of the inclined surface

15 (see FIG. 9). When the rotation angle of the trajectory deflector 6c is equal to 0 degrees, the treatment liquid travels directly without being deflected. Thereafter, the inclination angle of the inclined surface 15 becomes larger along with the increase in the rotation angle of the trajectory deflector 6c, and the treatment liquid is gradually deflected larger along with the increase in the rotation angle.

Here, FIG. 9 shows an example in which the incident angle and the reflection angle of the treatment liquid with respect to the inclined surface 15 are assumed to be equal to each other as in the case of the first embodiment, and the changes in the traveling direction of the treatment liquid are schematically illustrated with arrows. However, the traveling direction of the treatment liquid is not always changed as illustrated therein.

Here, the variation in the traveling direction (the trajectory variation) of the treatment liquid relative to the rotation angle of the trajectory deflector 6c in the range from 90 degrees to 180 degrees becomes reverse to the variation in the traveling direction of the treatment liquid relative to the rotation angle of the trajectory deflector 6c in the range from 0 degrees to 90 degrees. Meanwhile, the variation in the traveling direction of the treatment liquid relative to the rotation angle of the trajectory deflector 6c in the range from 180 degrees to 270 degrees is the same as the variation in the traveling direction of the treatment liquid relative to the rotation angle of the trajectory deflector 6c in the range from 0 degrees to 90 degrees. The variation in the traveling direction of the treatment liquid relative to the rotation angle of the trajectory deflector 6c in the range from 270 degrees to 360 degrees becomes reverse to the variation in the traveling direction of the treatment liquid relative to the rotation angle of the trajectory deflector 6c in the range from 0 degrees to 90 degrees.

Figure 10:
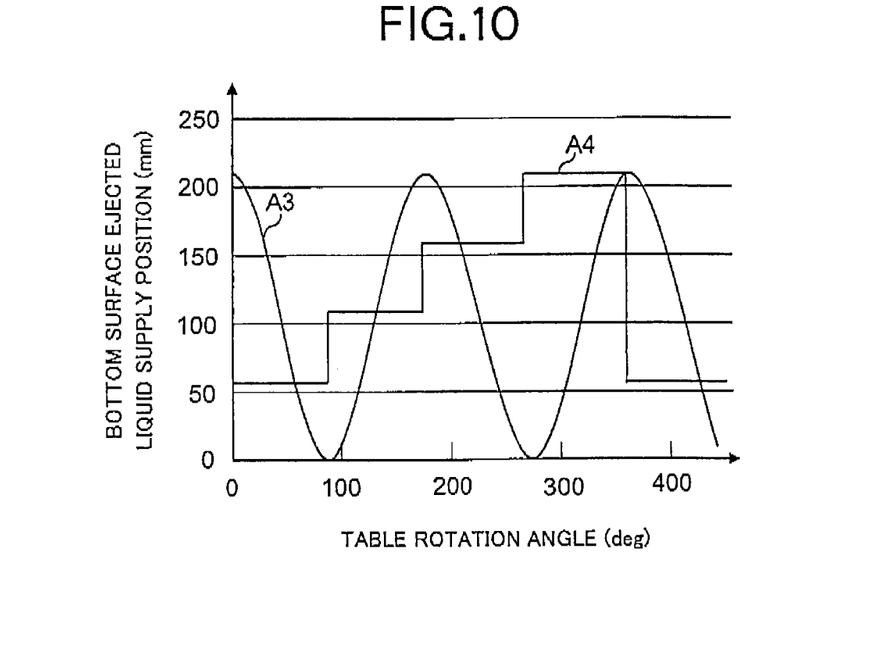
FIG. 10 is a graph showing a relation between a table rotation angle and a bottom surface ejected liquid supply position according to the second embodiment.

Here, as indicated with a graph A3 (a solid line) in FIG. 10, when the rotation angle of the trajectory deflector 6c transitions from 0 degrees to 90 degrees, the inclination angle of the inclined surface 15 is gradually increased (see FIG. 8 and FIG. 9), whereby the ejected liquid supply position (the bottom surface ejected liquid supply position) on the bottom surface of the substrate W gradually moves from 210 mm closer to 0 mm. Furthermore, when the rotation angle of the trajectory deflector 6c transitions from 90 degrees to 180 degrees, the inclination angle of the trajectory deflector 6c is gradually decreased, whereby the bottom surface ejected liquid supply position gradually moves away from 0 mm to 210 mm. Thereafter, when the rotation angle of the trajectory deflector 6c transitions from 180 degrees to 270 degrees, the inclination angle of the inclined surface 15 is gradually increased again, whereby the bottom surface ejected liquid supply position gradually moves from 210 mm closer to 0 mm. Furthermore, when the rotation angle of the trajectory deflector 6c transitions from 270 degrees to 360 degrees, the inclination angle of the trajectory deflector 6c is gradually decreased, whereby the bottom surface ejected liquid supply position gradually moves away from 0 mm to 210 mm. Thus, the bottom surface ejected liquid supply position is changed depending on the inclination angle of the inclined surface 15 of the trajectory deflector 6c.

Here, the bottom surface ejected liquid supply position (the collision position of the ejected liquid on the bottom surface of the substrate W) is set in the range from 0 mm to 210 mm. However, the setting is not limited to the foregoing as in the first embodiment. The bottom surface ejected liquid supply position can be adjusted by changing the inclination angle of the inclined surface 15 of the trajectory deflector 6c, the ejection angle of the nozzle 11, the clearance between the inclined surface 15 and the nozzle 11, and the like.

Figure 11:
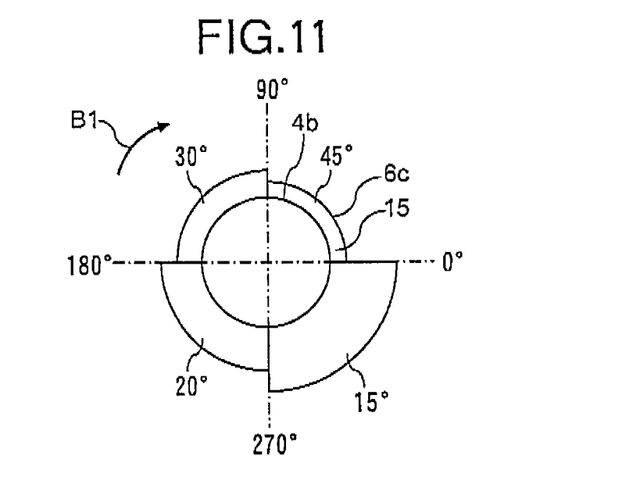
FIG. 11 is a plan view showing an inclined surface (a fourth example) of the trajectory deflector according to the second embodiment.

Next, a description will be given of a case where the inclined surface 15 of the trajectory deflector 6c is a non-smooth surface as shown in FIG. 11. For example, the inclination angle of the inclined surface 15 is equal to 45 degrees when the rotation angle of the trajectory deflector 6c is in the range from 0 degrees to 90 degrees, equal to 30 degrees when the rotation angle of the trajectory deflector 6c is in the range from 90 degrees to 180 degrees, equal to 20 degrees when the rotation angle of the trajectory deflector 6c is in the range from 180 degrees to 270 degrees, and equal to 15 degrees when the rotation angle of the trajectory deflector 6c is in the range from 270 degrees to 360 degrees. When the incident position of the treatment liquid on the inclined surface 15 having the above-described variation in the inclination angle moves in the direction of annular extension of the inclined surface 15 (the direction reverse to the rotational direction B1 of the substrate W), the traveling direction of the treatment liquid is gradually changed in accordance with the inclination angle of the inclined surface 15.

Here, as indicated with a graph A4 (a dashed line) in FIG. 10, when the rotation angle of the trajectory deflector 6c is in the range from 0 degrees to 90 degrees, the inclination angle of the inclined surface 15 is equal to 45 degrees (see FIG. 11), whereby the ejected liquid supply position (the bottom surface ejected liquid supply position) on the bottom surface of the substrate W is equal to about 60 mm. Furthermore, when the rotation angle of the trajectory deflector 6c is in the range from 90 degrees to 180 degrees, the inclination angle of the inclined surface 15 is equal to 30 degrees, whereby the bottom surface ejected liquid supply position is equal to about 110 mm. Likewise, when the rotation angle of the trajectory deflector 6c is in the range from 180 degrees to 270 degrees, the inclination angle of the inclined surface 15 is equal to 20 degrees, whereby the bottom surface ejected liquid supply position is equal to about 160 mm. Furthermore, when the rotation angle of the trajectory deflector 6c is in the range from 270 degrees to 360 degrees, the inclination angle of the inclined surface 15 is equal to 15 degrees, whereby the bottom surface ejected liquid supply position is equal to about 210 mm. Thus, the bottom surface ejected liquid supply position is changed depending on the inclination angle of the inclined surface 15 of the trajectory deflector 6c.

As described above, the traveling direction of the ejected liquid (the treatment liquid) ejected from the nozzle 11 is deflected toward the bottom surface of the substrate W by the inclined surface 15 of the trajectory deflector 6c, and a splattering angle of the treatment liquid is changed. Thus, the supply position (the landing position) of the ejected liquid on the bottom surface of the substrate W is changed in the radial direction of the substrate W. Accordingly, as compared to the case where the treatment liquid is supplied to one position on the bottom surface of the substrate W, for example, the treatment liquid can easily reach the outer peripheral portion on the bottom surface of the substrate W, whereby the bottom surface of the substrate W is more reliably covered with the treatment liquid. In this way, even when the substrate W is increased in size, it is possible to improve the coverage of the treatment liquid over the substrate W without increasing the amount of the treatment liquid, and thereby to suppress an increase in manufacturing cost. Moreover, it is not necessary to provide a movement mechanism for moving the nozzle 11 along the bottom surface of the substrate W in order to improve the coverage of the treatment liquid over the substrate W. Accordingly, it is possible to suppress an increase in equipment cost attributed to complication of the apparatus, and to suppress reduction in yield due to dust and grit caused by the movement of the nozzle by the movement mechanism during the treatment.

As described above, the second embodiment can achieve effects similar to those of the first embodiment. Specifically, since the second embodiment does not require the increase in amount of the treatment liquid or provision of a complicated mechanism, it is possible to improve the coverage of the treatment liquid over the substrate W while suppressing the increase in manufacturing cost or equipment cost as well as reduction in yield.

(Other Embodiments)

Figure 12:
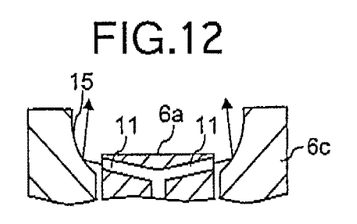
FIG. 12 is an explanatory view for explaining a modified example of the inclined surface of the trajectory deflector according to the first embodiment.

As shown in FIG. 12, the inclined surface 15 of the trajectory deflector 6c may be formed into a curved shape. The shape has no limitation as long as the inclined surface 15 can properly deflect the traveling direction of the treatment liquid ejected from the nozzle 11. In addition, the degree of curvature thereof is not limited either. For example, the inclined surface 15 may be formed into such a curved shape that projects toward the nozzle block 6a. Here, the incident position (the collision position) of the treatment liquid on the bottom surface of the substrate W can be easily controlled by adjusting the inclination angle of the inclined surface 15, i.e., the curved shape and the degree of curvature thereof.

Figure 13:
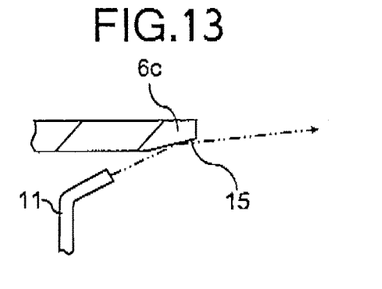
FIG. 13 is an explanatory view for explaining a modified example of the inclined surface of the trajectory deflector according to the second embodiment.

Meanwhile, as shown in FIG. 13, the inclined surface 15 of the trajectory deflector 6c may be formed at a lower end of the opening 4b or on any other member. The position to form the inclined surface has no limitation as long as the inclined surface 15 can properly deflect the traveling direction of the treatment liquid ejected from the nozzle 11.

Figure 14:
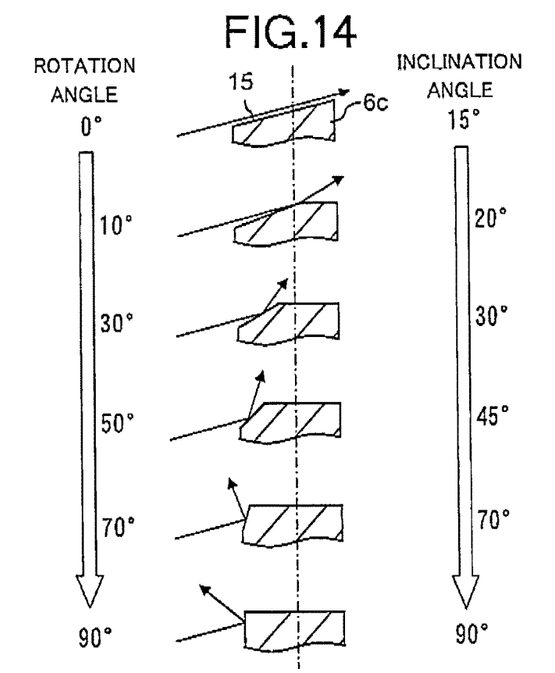
FIG. 14 is an explanatory view for explaining a modified example of the trajectory deflector according to the second embodiment.

In the meantime, as shown in FIG. 14, the trajectory deflector 6c may be formed to be capable of rotating about its center as the rotational axis. In the inclined surface 15 of the trajectory deflector 6c, the inclination angle varies relative to the rotation angle in the range from 0 degrees to 90 degrees, for example. The variation in the inclination angle is the same as the variation in the inclination angle of the second embodiment (see FIG. 9). In this case, the annular inclined surface 15 does not always have to extend in a range from 0 degrees to 360 degrees for one revolution. Instead, the inclined surface 15 only needs to extend for a necessary length such as a range from 0 degrees to 90 degrees or a range from 0 degrees to 180 degrees. Accordingly, the length of annular extension (a quasi-annular shape) of the inclined surface 15 is not limited as long as the inclined surface 15 can properly deflect the traveling direction of the treatment liquid ejected from the nozzle 11.

Moreover, in the above-described embodiments, the trajectory deflector Sc is used when the treatment liquid is supplied to the bottom surface of the substrate W. However, the usage of the trajectory deflector 6c is not limited to this configuration. The trajectory deflector 6c can also be used for supplying the treatment liquid to the top surface of the substrate W. In other words, the second treatment liquid supply unit 6 on the bottom surface side of the substrate W can be used as the first treatment liquid supply unit 5 on the top surface side thereof.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A substrate treatment apparatus comprising:
a table configured to support a substrate;
a nozzle provided below the substrate supported by the table configured to eject a treatment liquid onto a treatment target surface of a bottom surface of the substrate;
a trajectory deflector including a trajectory deflecting surface being an annular inclined surface designed to deflect a traveling direction of the treatment liquid ejected from the nozzle and to make the treatment liquid incident on the treatment target surface, the trajectory deflecting surface having an inclination angle varying in a direction of annular extension of the trajectory deflecting surface; and
a position changer configured to move an incident position of the treatment liquid on the trajectory deflecting surface in the direction of annular extension of the trajectory deflecting surface.

2. The substrate treatment apparatus according to claim 1, wherein the position changer is a rotation mechanism configured to rotate one or both of the nozzle and the trajectory deflector in the direction of annular extension of the trajectory deflecting surface about an axis intersecting with the treatment target surface as a rotation center, and to move the incident position of the treatment liquid on the trajectory deflecting surface in the direction of annular extension of the trajectory deflecting surface.

3. The substrate treatment apparatus according to claim 2, wherein the rotation mechanism is configured to rotate both of the nozzle and the trajectory deflector so that the nozzle and the trajectory deflector are rotated in reverse directions to each other.

4. The substrate treatment apparatus according to claim 1, wherein the trajectory deflecting surface is a continuous surface in which the inclination angle varies continuously.

5. The substrate treatment apparatus according to claim 2, wherein the trajectory deflecting surface is a continuous surface in which the inclination angle varies continuously.

6. The substrate treatment apparatus according to claim 3, wherein the trajectory deflecting surface is a continuous surface in which the inclination angle varies continuously.

7. The substrate treatment apparatus according to claim 1, wherein the trajectory deflecting surface is a non-smooth surface comprising a stepped surface for the inclined surface.

8. The substrate treatment apparatus according to claim 2, wherein the trajectory deflecting surface is a non-smooth surface comprising a stepped surface for the inclined surface.

9. The substrate treatment apparatus according to claim 3, wherein the trajectory deflecting surface is a non-smooth surface comprising a stepped surface for the inclined surface.

* * * * *